United States Patent
Lai et al.

(10) Patent No.: US 10,899,469 B2
(45) Date of Patent: Jan. 26, 2021

(54) METHOD, DEVICE AND SYSTEM FOR DETECTING MAGNETIC FIELD INTERFERENCE

(71) Applicant: SZ DJI TECHNOLOGY CO., LTD., Shenzhen (CN)

(72) Inventors: Zhenzhou Lai, Shenzhen (CN); Jianyu Song, Shenzhen (CN); Xiaogang Luo, Shenzhen (CN); Yun Yu, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 425 days.

(21) Appl. No.: 15/983,507

(22) Filed: May 18, 2018

(65) Prior Publication Data
US 2018/0265219 A1   Sep. 20, 2018

Related U.S. Application Data

(63) Continuation of application No. PCT/CN2015/095047, filed on Nov. 19, 2015.

(51) Int. Cl.
*G01C 17/38*   (2006.01)
*B64D 47/00*   (2006.01)
(Continued)

(52) U.S. Cl.
CPC .......... *B64D 47/00* (2013.01); *B64C 39/024* (2013.01); *B64D 45/00* (2013.01); *G01C 17/38* (2013.01);
(Continued)

(58) Field of Classification Search
CPC .................. G01C 17/38; B64D 47/00
(Continued)

(56) References Cited

U.S. PATENT DOCUMENTS 5,321,631 A * 6/1994 Germanetti ............... F41G 5/20
  33/356
7,451,549 B1 * 11/2008 Sodhi ..................... G01C 17/38
  33/356
(Continued)

FOREIGN PATENT DOCUMENTS

CN       1372127 A    10/2002
CN     101393022 A     3/2009
(Continued)

OTHER PUBLICATIONS

The World Intellectual Property Organization (WIPO) International Search Report for PCT/CN2015/095047 dated Aug. 22, 2016 8 Pages (including translation).

*Primary Examiner* — Christopher W Fulton
(74) *Attorney, Agent, or Firm* — Anova Law Group, PLLC

(57) ABSTRACT

A method of detecting a magnetic field interference includes obtaining magnetic field information measured by each one of n magnetometers carried by a movable object, determining magnetic differences between the magnetic field information measured by m magnetometers of the n magnetometers, and determining whether the movable object is subject to a magnetic field interference based on the magnetic differences. n is an integer greater than or equal to 2, and m is an integer greater than or equal to 2 but smaller than or equal to n.

20 Claims, 8 Drawing Sheets

(51) Int. Cl.
*G01R 33/02* (2006.01)
*G01R 33/038* (2006.01)
*B64C 39/02* (2006.01)
*B64D 45/00* (2006.01)
*G01R 33/022* (2006.01)

(52) U.S. Cl.
CPC ........... *G01R 33/02* (2013.01); *G01R 33/022* (2013.01); *G01R 33/0385* (2013.01); *B64C 2201/141* (2013.01); *B64C 2201/145* (2013.01)

(58) Field of Classification Search
USPC .......................................................... 33/356
See application file for complete search history.

(56) References Cited

U.S. PATENT DOCUMENTS

| | | | | |
|---|---|---|---|---|
| 7,895,002 | B2* | 2/2011 | Ikkink | G01C 17/38 702/41 |
| 8,838,403 | B2* | 9/2014 | del Castillo | G01C 17/38 702/92 |
| 2004/0123474 | A1 | 7/2004 | Manfred et al. | |
| 2006/0152217 | A1* | 7/2006 | Withanawasam | G01C 17/38 324/244 |
| 2010/0307015 | A1* | 12/2010 | Mayor | G01C 17/38 33/303 |
| 2011/0066392 | A1* | 3/2011 | Judd | G01C 17/38 702/93 |
| 2011/0077889 | A1* | 3/2011 | Vogt | G01C 17/38 702/93 |
| 2013/0238269 | A1* | 9/2013 | Sheng | G01R 33/022 702/92 |
| 2013/0320966 | A1* | 12/2013 | Oliver | G01R 33/0035 324/202 |
| 2015/0153151 | A1* | 6/2015 | Kochanski | G01B 7/004 702/150 |
| 2016/0334219 | A1* | 11/2016 | Askarpour | G01C 21/18 |
| 2017/0123035 | A1* | 5/2017 | Clark | B64C 39/024 |

FOREIGN PATENT DOCUMENTS

| | | |
|---|---|---|
| CN | 101487707 A | 7/2009 |
| CN | 101881800 A | 11/2010 |
| CN | 102589537 A | 7/2012 |
| CN | 102692608 A | 9/2012 |
| CN | 102879010 A | 1/2013 |
| CN | 103837845 A | 6/2014 |
| CN | 104237822 A | 12/2014 |
| CN | 104535065 A | 4/2015 |
| CN | 104787348 A | 7/2015 |
| CN | 104808250 A | 7/2015 |
| CN | 205311920 U | 6/2016 |

* cited by examiner

METHOD, DEVICE AND SYSTEM FOR DETECTING MAGNETIC FIELD INTERFERENCE

CROSS-REFERENCE TO RELATED APPLICATION

This is a continuation application of International Application No. PCT/CN2015/095047, filed on Nov. 19, 2015, the entire contents of which are incorporated herein by reference.

TECHNICAL FIELD

The disclosure relates to electromagnetic field technology, and more particularly to a method, device and system for detecting a magnetic field interference.

BACKGROUND OF THE DISCLOSURE

The navigation system of unmanned aerial vehicles (UAVs) can comprise a compass which is configured to estimate a heading of the UAV. However, the compass is subject to magnetic field interference, causing the estimated heading incorrect. Various GPS-based functionalities of the UAV (e.g., return, hovering in GPS mode) can thus be affected, and an attitude of the UAV can be out of control. There is a need to prevent a compass's measurement on the Earth's magnetic field from any magnetic field interference. In case an external magnetic field interference is inevitable, the UAV shall be capable of determining the compass is being interfered to provide a safety prompt information to the operator. The UAV's taking off from a ground having a steel reinforced concrete configuration can be risky as most of the magnetic field interference originates from the ground which distorts the Earth's magnetic field in proximal to the ground.

In existing method of detecting a magnetic field interference, a magnetic field magnitude can be monitored. For instance, assuming the magnetic field magnitude measured by a calibrated compass in absence of magnetic field interference being equal to the magnitude of the Earth's magnetic field, a determination can be made that the compass is interfered by a magnetic field if a difference between the measured magnetic field magnitude and the magnitude of local Earth's magnetic field exceeds a preset threshold.

However, the magnetic field can change in both magnitude and direction. For example, a change in the direction of a magnetic field can be significant while a change in the magnetic field magnitude is minor. A direction measurement of the compass can be affected if a change in the magnetic field direction is significant. The interference on direction measurement cannot be accurately measured as a distribution of the magnetic field interference is not uniform in proximal to the ground. As a result, a safety in UAV's taking off can be guaranteed as the UAV is subject to the magnetic field interference in proximal to the ground.

SUMMARY OF THE DISCLOSURE

The disclosure provides a method, device and system for detecting a magnetic field interference to address the low sensitivity and accuracy of a movable object in detecting a magnetic field interference.

An first aspect of the disclosure provides a method of detecting a magnetic field interference for a movable object, the movable object being provided with n magnetometers, n being an integer greater than 1. In some embodiments, the method can comprise: obtaining magnetic field information measured by each one of the n magnetometers; determining a magnetic difference between respective magnetic field information measured by each one of m magnetometers, m being an integer greater than or equal to 2 but not greater than n; and determining whether the movable object is subject to a magnetic field interference based on the magnetic difference.

In a first implementation of the first aspect of the disclosure, the magnetic field information can comprise a magnetic field vector. In some embodiments, determining a magnetic difference between respective magnetic field information measured by each one of the m magnetometers and determining whether the movable object is subject to a magnetic field interference based on the magnetic difference can comprise calculating a difference between respective magnetic field vector measured by each one of the m magnetometers and a vector of local magnetic field to obtain a set of differences, and determining whether the movable object is subject to a magnetic field interference based on the set of differences.

In a second implementation of the first aspect of the disclosure on basis of the first implementation, the magnetic field vector can comprise a magnetic field direction. In some embodiments, the set of differences can comprise a first set of angles, which angle being an angle between magnetic field directions measured by the plurality of magnetometers. In some embodiments, determining whether the movable object is subject to a magnetic field interference based on the magnetic difference comprises determining the movable object is subject to a magnetic field interference if a maximum angle in the first set exceeds a predetermined angle threshold.

In a third implementation of the first aspect of the disclosure on basis of the first or second implementation, the magnetic field vector can comprise a magnetic field magnitude. In some embodiments, the set of differences can comprise a second set of magnitude difference, which magnitude difference being a difference between a magnetic field magnitude measured by each of the m magnetometers and a magnitude of local magnetic field. In some embodiments, determining whether the movable object is subject to a magnetic field interference based on the magnetic difference can comprise determining the movable object is subject to a magnetic field interference if a maximum magnitude difference in the second set exceeds a predetermined magnitude threshold.

In a fourth implementation of the first aspect of the disclosure, the magnetic field information can comprise a magnetic field direction. In some embodiments, determining a magnetic difference between respective magnetic field information measured by each one of the m magnetometers and determining whether the movable object is subject to a magnetic field interference based on the magnetic difference can comprise calculating a first set of m angles, which angle being an angle between a respective magnetic field direction measured by each of the m magnetometers and a direction of local magnetic field; and determining the movable object is subject to a magnetic field interference if a maximum angle in the first set exceeds a predetermined angle threshold.

In a fifth implementation of the first aspect of the disclosure on basis of the first aspect or the fourth implementation, the magnetic field information can comprise a magnetic field magnitude. In some embodiments, determining a magnetic difference between respective magnetic field information measured by each one of the m magnetometers and determining whether the movable object is subject to a magnetic field interference based on the magnetic difference can comprise calculating a second set of m magnitude differences, which magnitude difference being a difference between a respective magnetic field magnitude measured by each of the m magnetometers and a magnitude of local magnetic field; and determining the movable object is subject to a magnetic field interference if a maximum magnitude difference in the second set exceeds a predetermined magnitude threshold.

In a sixth implementation of the first aspect of the disclosure on basis of any one of the first to the third implementations, the movable object can be provided with a first magnetometer and a second magnetometer, during a movement of the movable object, the first magnetometer being positioned on the movable object at a position having a distance from a local magnetic field not less than a first threshold, and the second magnetometer being positioned on the movable object at a position having a distance from the local magnetic field greater than the first threshold. In some embodiments, calculating a difference between respective magnetic field vector measured by each one of the m magnetometers and a vector of local magnetic field to obtain a set of differences and determining whether the movable object is subject to a magnetic field interference based on the set of differences can comprise obtaining a first magnetic field vector measured by the first magnetometer and a second magnetic field vector measured by the second magnetometer; calculating a difference between the first magnetic field vector and the vector of local magnetic field, calculating a difference between the second magnetic field vector and the vector of local magnetic field, and calculating an angle between the first magnetic field vector and the second magnetic field vector; and determining the movable object is subject to an interference from local magnetic field if a greater one of the difference between the first magnetic field vector and the vector of local magnetic field and the difference between the second magnetic field vector and the vector of local magnetic field exceeds a second threshold and the angle exceeds a third threshold.

In a seventh implementation of the first aspect of the disclosure on basis of the sixth implementation, when the movable object is in a normal moving state, the first magnetometer and the second magnetometer can be magnetometers having a largest difference in height along a direction of gravity.

In an eighth implementation of the first aspect of the disclosure, determining whether the movable object is subject to a magnetic field interference based on the magnetic difference can comprise determining a maximum magnetic difference from among the magnetic difference between respective magnetic field information measured by each one of the m magnetometers, and determining whether the movable object is subject to a magnetic field interference based on the maximum magnetic difference.

In a ninth implementation of the first aspect of the disclosure, the magnetic difference between respective magnetic field information measured by each one of the m magnetometers can comprise at least one of a difference between respective magnetic field magnitude measured by each one of the m magnetometers and a magnitude of local magnetic field, and/or an angle between magnetic field directions measured by the m magnetometers.

In a tenth implementation of the first aspect of the disclosure, prior to obtaining magnetic field information measured by each one of the n magnetometers, the method can further comprise obtaining a calibration record of the n magnetometers; and calibrating a magnetometer which is not successfully calibrated if a determination is made that one or more of the n magnetometers are not successfully calibrated based on the calibration record.

In an eleventh implementation of the first aspect of the disclosure on basis of the first aspect and any one of the first to the tenth implementations, once a determination is made that the movable object is subject to an interference from local magnetic field, the method can further comprise obtaining a current device state of the movable object, and directing the movable object to automatically initiating a protection control command or sending an alert notification to a control terminal according to the current device state.

In a twelfth implementation of the first aspect of the disclosure on basis of the eleventh implementation, the movable object can comprise an aircraft. In some embodiments, obtaining a current device state of the movable object and the movable object automatically initiating a protection control command or sending an alert notification to a control terminal according to the current device state can comprise initiating a command instructing the aircraft to stop a taking off if the current device state of the aircraft shows the aircraft is taking off; and/or initiating a command instructing the aircraft device to return if the current device state of the aircraft shows the aircraft is in a flight.

In a thirteenth implementation of the first aspect of the disclosure on basis of the first aspect and any one of the first to the twelfth implementations, once a determination is made that the movable object is subject to an interference from local magnetic field, the method can further comprise determining a position of the local magnetic field from a magnetic field vector of the local magnetic field, the notification message comprising interference information which comprising the position of the local magnetic field.

In a fourteenth implementation of the first aspect of the disclosure on basis of the first aspect, the n magnetometers can be disposed at positions having different height with respect to a top of the movable object.

In a fifteenth implementation of the first aspect of the disclosure on basis of the first aspect, the n magnetometers can be provided at various positions of the movable object including at least one of a landing gear of the movable object, a body of the movable object, an arm of the movable object, a carrier of the movable object and a load of the movable object.

A second aspect of the disclosure provides a system for detecting a magnetic field interference for a movable object. The system can comprise at least one processor, each one of the at least one processor operating individually or collectively. The processor can be configured to obtain magnetic field information measured by each one of the n magnetometers, n being an integer greater than 1; determine a magnetic difference between respective magnetic field information measured by each one of the n magnetometers; and determine whether the movable object is subject to a magnetic field interference based on the magnetic difference.

In a first implementation of the second aspect of the disclosure, the magnetic field information can comprise a magnetic field vector. In some embodiments, the processor can be configured to calculate a difference between respective magnetic field vector measured by each one of m magnetometers and a vector of local magnetic field to obtain a set of differences, and determine whether the movable object is subject to a magnetic field interference based on the set of differences.

In a second implementation of the second aspect of the disclosure on basis of the first implementation, the magnetic field vector can comprise a magnetic field direction. In some embodiments, the set of differences can comprise a first set of angles, which angle being an angle between a magnetic field direction measured by each one of the plurality of magnetometers and a direction of local magnetic field. In some embodiments, the processor can be configured to determine the movable object is subject to a magnetic field interference if a maximum angle in the first set exceeds a predetermined angle threshold.

In a third implementation of the second aspect of the disclosure on basis of the first implementation, the magnetic field vector can comprise a magnetic field magnitude. In some embodiments, the set of differences can comprise a second set of magnitude difference, which magnitude difference being a difference between a magnetic field magnitude measured by each of the m magnetometers and a magnitude of local magnetic field. In some embodiments, the processor can be configured to determine the movable object is subject to a magnetic field interference if a maximum magnitude difference in the second set exceeds a predetermined magnitude threshold.

In a fourth implementation of the second aspect of the disclosure, the magnetic field information can comprise a magnetic field direction. In some embodiments, the processor can be configured to calculate a first set of m angles, which angle being an angle between a respective magnetic field direction measured by each of the m magnetometers and a direction of local magnetic field, and determine the movable object is subject to a magnetic field interference if a maximum angle in the first set exceeds a predetermined angle threshold.

In a fifth implementation of the second aspect of the disclosure on basis of the second aspect and any one of the first to the fourth implementations, the magnetic field information can comprise a magnetic field magnitude. In some embodiments, the processor can be configured to calculate a second set of m magnitude differences, which magnitude difference being a difference between a respective magnetic field magnitude measured by each of the m magnetometers and a magnitude of local magnetic field, and determine the movable object is subject to a magnetic field interference if a maximum magnitude difference in the second set exceeds a predetermined magnitude threshold.

In a sixth implementation of the second aspect of the disclosure on basis of any one of the first to the third implementations, the movable object can be provided with a first magnetometer and a second magnetometer, during a movement of the movable object, the first magnetometer being positioned on the movable object at a position having a distance from a local magnetic field not less than a first threshold, and the second magnetometer being positioned on the movable object at a position having a distance from the local magnetic field greater than the first threshold. In some embodiments, the processor can be configured to obtain a first magnetic field vector measured by the first magnetometer and a second magnetic field vector measured by the second magnetometer; calculate a difference between the first magnetic field vector and the vector of local magnetic field, calculate a difference between the second magnetic field vector and the vector of local magnetic field, and calculate an angle between the first magnetic field vector and the second magnetic field vector; and determine the movable object is subject to an interference from local magnetic field if a greater one of the difference between the first magnetic field vector and the vector of local magnetic field and the difference between the second magnetic field vector and the vector of local magnetic field exceeds a second threshold and the angle exceeds a third threshold.

In a seventh implementation of the second aspect of the disclosure, when the movable object is in a normal moving state, the first magnetometer and the second magnetometer can be magnetometers having a largest difference in height along a direction of gravity.

In an eighth implementation of the second aspect of the disclosure on basis of any one of the second to the seventh implementations, the processor can be configured to determine a maximum magnetic difference from among the magnetic difference between respective magnetic field information measured by each one of the m magnetometers, and determine whether the movable object is subject to a magnetic field interference based on the maximum magnetic difference.

In a ninth implementation of the second aspect of the disclosure, the magnetic difference between respective magnetic field information measured by each one of the m magnetometers can comprise at least one of a difference between respective magnetic field magnitude measured by each one of the m magnetometers and a magnitude of local magnetic field, and/or an angle between magnetic field directions measured by the m magnetometers.

In a tenth implementation of the second aspect of the disclosure, prior to obtaining magnetic field information measured by each one of the n magnetometers, the processor can be configured to obtain a calibration record of the n magnetometers; and calibrate a magnetometer which is not successfully calibrated if a determination is made that one or more of the n magnetometers are not successfully calibrated based on the calibration record.

In an eleventh implementation of the second aspect of the disclosure on basis of the second aspect and any one of the first to the tenth implementations, once a determination is made that the movable object is subject to an interference from local magnetic field, the processor can be configured to obtain a current device state of the movable object, and direct the movable object to automatically initiate a protection control command or sending an alert notification to a control terminal according to the current device state.

In a twelfth implementation of the second aspect of the disclosure on basis of the tenth implementation, the processor can be configured to initiate a command instructing an aircraft to stop a taking off if a current device state of the aircraft shows the aircraft is taking off; and/or initiate a command instructing an aircraft device to return if a current device state of the aircraft shows the aircraft is in a flight.

In a thirteenth implementation of the second aspect of the disclosure on basis of the second aspect and any one of the first to the twelfth implementations, once a determination is made that the movable object is subject to an interference from local magnetic field, the processor can be configured to determine a position of the local magnetic field from a magnetic field vector of the local magnetic field, the notification message comprising interference information which comprising the position of the local magnetic field.

In a fourteenth implementation of the second aspect of the disclosure, the n magnetometers can be disposed at positions having different height with respect to a top of the movable object.

In a fifteenth implementation of the second aspect of the disclosure, the n magnetometers can be provided at various positions of the movable object including at least one of a landing gear of the movable object, a body of the movable object, an arm of the movable object, a carrier of the movable object and a load of the movable object.

A third aspect of the disclosure provides a system for detecting a magnetic field interference for a movable object. The system can comprise n magnetometers, each of which being configured to measure magnetic field information of a magnetic field in which the movable object is positioned; and a processor according to the second aspect and any one of the first to the fifteenth implementations. In some embodiments, the processor can be in communication connection with the n magnetometers.

A fourth aspect of the disclosure provides a movable object. The movable object can comprise a body frame; n magnetometers, the n magnetometers being disposed at different positions of the body frame, each one of the n magnetometers being configured to measure magnetic field information of a magnetic field in which the movable object is positioned, n being an integer greater than or equal to 2; and a processor according to the second aspect and any one of the first to the fifteenth implementations. In some embodiments, the processor can be in communication connection with the n magnetometers.

In a first implementation of the fourth aspect of the disclosure, the n magnetometers can be provided at different height with respect to a top of the movable object.

In a second implementation of the fourth aspect of the disclosure on basis of the first implementation, the body frame can comprise a body, an arm which is coupled to the body, and a landing gear which is coupled to the body.

In a third implementation of the fourth aspect of the disclosure on basis of the second implementation, the n magnetometers can be provided at various positions of the movable object including at least one of the landing gear, the body, the arm, a carrier of the movable object, or a load of the movable object.

With embodiments of the disclosure, magnetic field information measured by the n magnetometers can be obtained, a magnetic difference between respective magnetic field information measured by m magnetometers can be calculated, and a determination can be made on whether the movable object is subject to a magnetic field interference based on the magnetic difference. A detection on an interference from a non-uniform local magnetic field can be effected, and a sensitivity in interference detection and a safety of the movable object can be improved.

DETAILED DESCRIPTION OF THE DISCLOSURE

A better understanding of the disclosure will be obtained by reference to the following detailed description that sets forth illustrative embodiments with reference to the drawings. It will be apparent that, the embodiments described herein are merely provided by way of example only. Those skilled in the art can conceive various embodiments in light of those embodiments disclosed herein without inventive efforts, and all these embodiments are within the scope of the disclosure.

As used in the description, claims and drawings of the disclosure, terms "first", "second" and the like are used to distinguish similar objects, rather than indicating a specific order or sequence. It will be appreciated that, terms provided in this manner can be interchangeable in appropriate situations, such that embodiments thus described can be implemented in a sequence other than those illustrated or described herein. In addition, terms "include", "comprise", "have" and any variations thereof are intended to encompass non-exclusive inclusion. For example, a process, method, system, product or device that is described to include a series of steps or modules is not necessarily limited to include those steps or modules explicitly listed; instead, other steps or modules that are not explicitly listed or are intrinsic to the process, method, system, product or device can also be included. A division of modules and units described herein is merely a logical division, and various other divisions can be possible. For example, various modules can be combined or integrated into another system, or certain features can be omitted or not performed. Moreover, a coupling, a direct coupling or a communication connection as illustrated or discussed in the disclosure can be an indirect coupling or a communication connection via certain interfaces, and can be an electrical coupling, a mechanical coupling or a coupling in other forms, which is not limited herein. Modules or sub-modules illustrated as separate parts can or can not be physically separated, can or can not be physical modules, and can be distributed over a plurality of circuit modules. All or part of the modules can be selected to implement the embodiments of the disclosure according to actual requirements.

The disclosure provides a methods device and system for detecting a magnetic field interference for movable objects (e.g., UAVs, airplanes, small aircrafts) which can effect a fast movement. The disclosure will be described in the illustrative embodiments by reference to the drawings.

Figure 1:
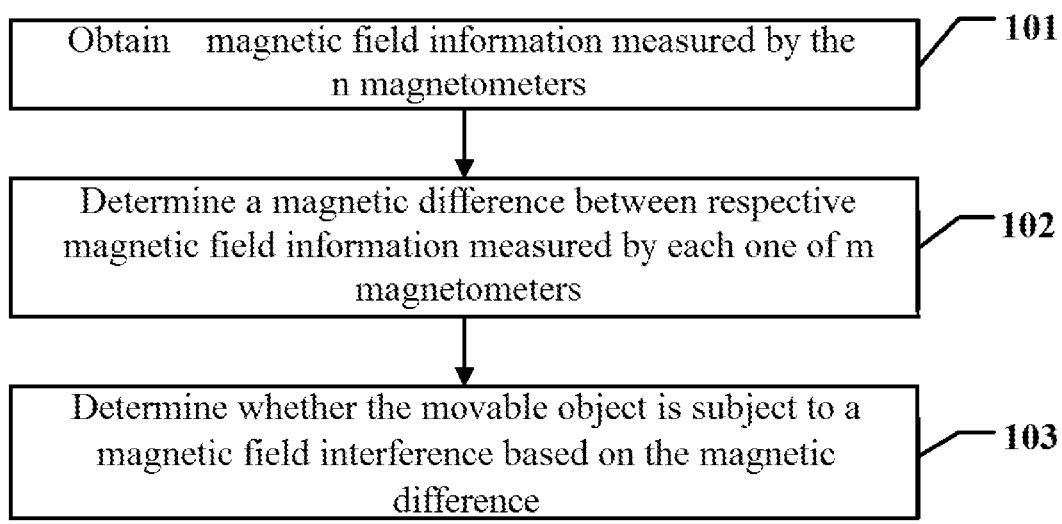
FIG. 1 shows a flow chart of a method of detecting a magnetic field interference according to embodiments of the disclosure.
Figure 2:
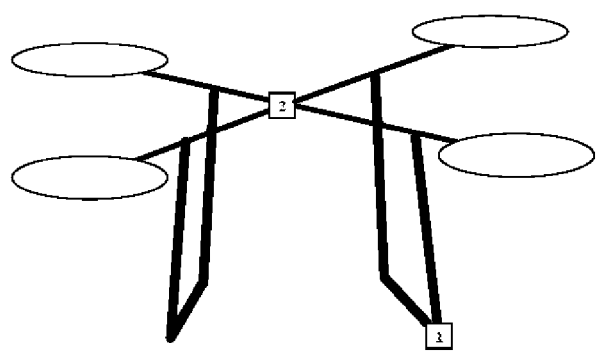
FIG. 2 shows a configuration of an unmanned aerial vehicle (UAV) provided with a compass according to embodiments of the disclosure.

FIG. 1 and FIG. 2 show a method of detecting a magnetic field interference provided by the disclosure. The movable object be provided with n magnetometers, where n is an integer greater than 1. In some embodiments, the method of detecting a magnetic field interference can comprise steps 101 to 103.

In step 101, magnetic field information measured by the n magnetometers can be obtained.

The magnetic field information can include any information that can be used to determine whether the movable object is subject to a magnetic field interference. For instance, the magnetic field information can comprise a magnetic field vector. The magnetic field vector can comprise a magnitude and a magnetic field direction. The magnetic field information to be measured can be determined in view of actual applications, and is not limited in the disclosure.

In some instances, prior to obtaining magnetic field information measured by the n magnetometers, the method can further comprise checking whether the magnetometers operate in a normal operating state. For instance, a calibration record of the n magnetometers can be obtained, and any magnetometer which is not successfully calibrated can be calibrated if a determination is made that one or more of the n magnetometers are not successfully calibrated based on the calibration record. With the checking procedure, the method of detecting a magnetic field interference can be free from an influence caused by an inherent magnetic bias at various positions of the aircraft and an error in deploying the compass.

The magnetometer can comprise a device capable of measuring a magnetic flux density of the magnetic field, such as a compass. In some embodiments, the n magnetometers can be provided at different height with respect to a top of the movable object.

In some embodiments, the n magnetometers can be provided at various positions of the movable object including at least one of a landing gear of the movable object, a body of the movable object, an arm of the movable object, a carrier of the movable object and a load of the movable object.

In step 102, a magnetic difference between respective magnetic field information measured by each one of m magnetometers can be determined, where m is an integer greater than 1 but not greater than n.

In some instances, the magnetic field information can comprise a magnetic field magnitude. The magnetic difference can indicate a difference between respective magnetic field magnitude measured by the m magnetometers and a magnitude of a local magnetic field. Optionally, the magnetic field information can comprise a magnetic field direction. The magnetic difference can indicate an angle between respective magnetic field direction measured by the m magnetometers and a direction of the local magnetic field. Optionally, the magnetic field information can comprise a magnetic field vector. The magnetic difference can indicate a difference between respective magnetic field magnitude measured by the m magnetometers and a magnitude of the local magnetic field and an angle between respective magnetic field direction measured by the m magnetometers and a direction of the local magnetic field.

In step 103, a determination can be made on whether the movable object is subject to a magnetic field interference based on the magnetic difference.

A difference threshold can be preset set. For instance, a first threshold can be set with respect to the magnetic field magnitude. A determination can be made that the movable object is subject to an interference from the local magnetic field if the difference in magnitude exceeds the first threshold. For instance, a first angle threshold can be set with respect to the magnetic field direction. A determination can be made that the movable object is subject to an interference from the local magnetic field if the difference in direction exceeds the first angle threshold. For instance, a first threshold can be set with respect to the magnetic field magnitude and a first angle threshold can be set with respect to the magnetic field direction. A determination can be made that the movable object is subject to an interference from the local magnetic field if the difference in magnitude exceeds the first threshold and the difference in direction exceeds the first angle threshold.

In some embodiments, once a determination is made that the movable object is subject to an interference from the local magnetic field, an operation can be performed to avoid the magnetic field interference. At least two operations are possible to avoid the magnetic field interference.

The first operation can comprise initiating a protection control command or providing an alert notification.

In some instances, the first operation can comprise obtaining a current device state of the movable object, and the movable object automatically initiating the protection control command or sending an alert notification to a control terminal according to the current device state.

In some instances, the movable object can be an aircraft. The protection control command can be initiated according to the device state of the aircraft to avoid any accident in a short period of time.

For instance, a command instructing the aircraft to stop a taking off can be initiated if the device state of the aircraft shows the aircraft is taking off.

For instance, a command instructing the aircraft to return can be initiated if the device state of the aircraft shows the aircraft is in a flight.

The second operation can comprise reporting an interference source information to a control terminal.

In some instances, a position of the local magnetic field can be determined from a magnetic field vector of the local magnetic field. The alert notification can comprise the interference source information which comprising the position of the local magnetic field.

With embodiments of the disclosure, magnetic field information measured by the n magnetometers can be obtained, a magnetic difference between respective magnetic field information measured by m magnetometers can be determined, and a determination can be made on whether the movable object is subject to a magnetic field interference based on the magnetic difference. A detection on an interference from a non-uniform local magnetic field can be effected, and a sensitivity in interference detection and a safety of the movable object can be improved.

In some embodiments, a content of the magnetic field information can be set to determine whether the movable object is subject to an interference from the local magnetic field.

For instance, the magnetic field information can comprise a magnetic field vector.

A difference between a magnetic field vector measured by each of the m magnetometers and a vector of local magnetic field can be calculated to obtain a set of differences, also referred to as "a set of vector differences," and a determination on whether the movable object is subject to a magnetic field interference can be made based on the set of differences. In the process of determining whether the movable object is subject to a magnetic field interference, both a direction and a magnetic field magnitude can be used as the magnetic field vector comprises the direction and the magnetic field magnitude. A detailed description on the process of determining whether the movable object is subject to a magnetic field interference based on a magnetic field direction and a magnetic field magnitude will be provided in the following detailed description.

In some embodiments, a magnetic field vector measured by at least one magnetometer can be obtained, and a difference between the magnetic field vector measured by the at least one magnetometer and a vector of local magnetic field can be calculated. A determination can be made on whether the movable object is subject to a magnetic field interference can be made based on the calculated difference.

A detection on an interference from a non-uniform local magnetic field can be effected, and a sensitivity in interference detection and a safety of the movable object can be improved.

For instance, the magnetic field information can comprise a magnetic field direction.

The set of differences can comprise a first set of angles, which angle is an angle between magnetic field directions measured by the plurality of magnetometers. A determination on whether the movable object is subject to a magnetic field interference can be made based on at least one angle in the first set. For instance, a determination that movable object being subject to a magnetic field interference can be made if at least one angle in the first set exceeds a predetermined angle threshold.

For example, a determination that the movable object being subject to a magnetic field interference can be made if a maximum angle in the first set exceeds a predetermined angle threshold.

An incorrect determination that the movable object is not subject to a magnetic field interference can be avoided where a change in magnetic field magnitude is minor and a change in magnetic field direction is significant. A detection on an interference from a non-uniform local magnetic field can be effected, and a sensitivity in interference detection and a safety of the movable object can be improved.

For instance, the magnetic field information can comprise a magnetic field magnitude.

The set of differences can comprise a second set of magnitude difference, which magnitude difference is a difference between a magnetic field magnitude measured by each of the m magnetometers and a magnitude of local magnetic field. A determination on whether the movable object is subject to a magnetic field interference can be made based on at least one magnitude difference in the second set. For instance, a determination that movable object being subject to a magnetic field interference can be made if at least one magnitude difference in the second set exceeds a predetermined magnitude threshold.

For example, a determination that the movable object being subject to a magnetic field interference can be made if a maximum magnitude difference in the second set exceeds a predetermined magnitude threshold.

An accuracy in detecting an interference from a non-uniform magnetic field can be increased and a sensitivity in interference detection and a safety of the movable object can be improved by increasing the number of magnetometers.

Figure 3:
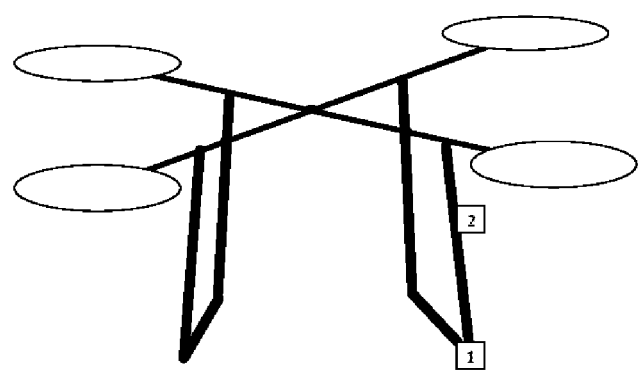
FIG. 3 shows a configuration of a UAV provided with a compass according to embodiments of the disclosure.
Figure 4:
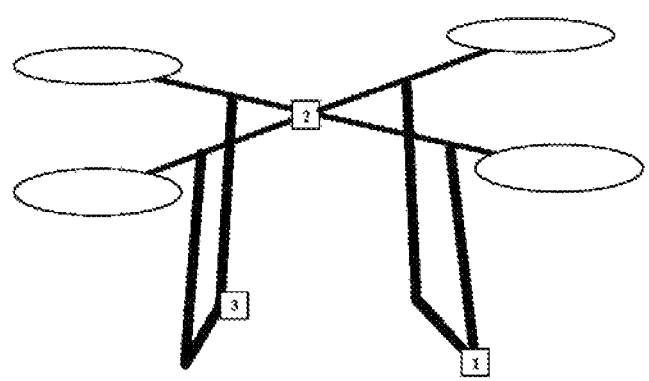
FIG. 4 shows a configuration of a UAV provided with a compass according to embodiments of the disclosure.

In some embodiments, when the movable object is subject to an interference from local magnetic field during a flight, a data measured by magnetometers, based on which a determination on whether the movable object is subject to an interference from local magnetic field is made, can be selected based on a position of the local magnetic field. For instance, a magnetic field magnitude having maximum difference (e.g., a maximum magnitude difference) and/or a magnetic field direction having a maximum angle (e.g., a maximum angle difference) can be selected from the set of differences. In some instances, a compass positioned at a bottom of a landing gear of the aircraft (shown in FIG. 2) can be more likely to be affected by an interference from a ground magnetic field as compared to a compass positioned at a top of the aircraft (shown in FIG. 3), as most of the magnetic field interference originates from the ground. Therefore, a magnetic field vector measured by the compass positioned at a bottom of a landing gear of the aircraft and a compass positioned at a top of the aircraft can be used to determine whether the movable object is subject to an interference from the ground magnetic field. In some instances, the compasses, from which a measurement is used to determine whether the movable object is subject to an interference, can be selected based on a position of the local magnetic field and an attitude of the movable object (e.g., a flight attitude, a diving, a stable flight, or a hovering).

In some embodiments, the movable object can be provided with a first magnetometer and a second magnetometer. During a movement of the movable object, the first magnetometer can be positioned on the movable object at a position having a distance from the local magnetic field not less than a first threshold, and the second magnetometer can be positioned on the movable object at a position having a distance from the local magnetic field greater than the first threshold.

In some embodiments, the process of calculating a difference between a magnetic field vector measured by each of the m magnetometers and a vector of local magnetic field to obtain a set of differences, and determining whether the movable object is subject to a magnetic field interference based on the set of differences can comprise obtaining a first magnetic field vector measured by a first magnetometer and a second magnetic field vector measured by a second magnetometer; calculating a difference between the first magnetic field vector and a vector of local magnetic field, calculating a difference between the second magnetic field vector and the vector of local magnetic field, and calculating an angle between the first magnetic field vector and the second magnetic field vector; and determining the movable object is subject to an interference from local magnetic field if a greater one of the difference between the first magnetic field vector and the vector of local magnetic field and the difference between the second magnetic field vector and the vector of local magnetic field exceeds a second threshold and the angle exceeds a third threshold.

In some embodiments, when the movable object is in a normal moving state, the first magnetometer and the second magnetometer can be magnetometers having a largest difference in height along a direction of gravity.

In some embodiments, the process of determining whether the movable object is subject to a magnetic field interference can comprise determining a largest magnetic difference from the magnetic difference between respective magnetic field information measured by m magnetometers, and determining whether the movable object is subject to a magnetic field interference based on the largest magnetic difference.

In some embodiments, the magnetic difference between respective magnetic field information measured by m magnetometers can comprise at least one of a magnitude difference, which is a difference between respective magnetic field magnitude measured by the m magnetometers and a magnitude of local magnetic field, and/or an angle between respective magnetic field direction measured by the m magnetometers.

In some embodiments, the process of determining whether the movable object is subject to a magnetic field interference based on the largest magnetic difference with respect to the magnetic field magnitude and the magnetic field direction can comprise (a) determining whether the movable object is subject to a magnetic field interference if a maximum angle in the set of differences exceeds a predetermined angle threshold, or (b) determining whether the movable object is subject to a magnetic field interference if a maximum magnitude in the set of differences exceeds a predetermined magnitude threshold.

In some embodiments, the movable object can be subject to a magnetic field interference in various directions as a position of the local earth magnetic field may not be stationery. The compasses, from which a measurement is used to determine whether the movable object is subject to an interference, can be dynamically altered.

Figure 5:
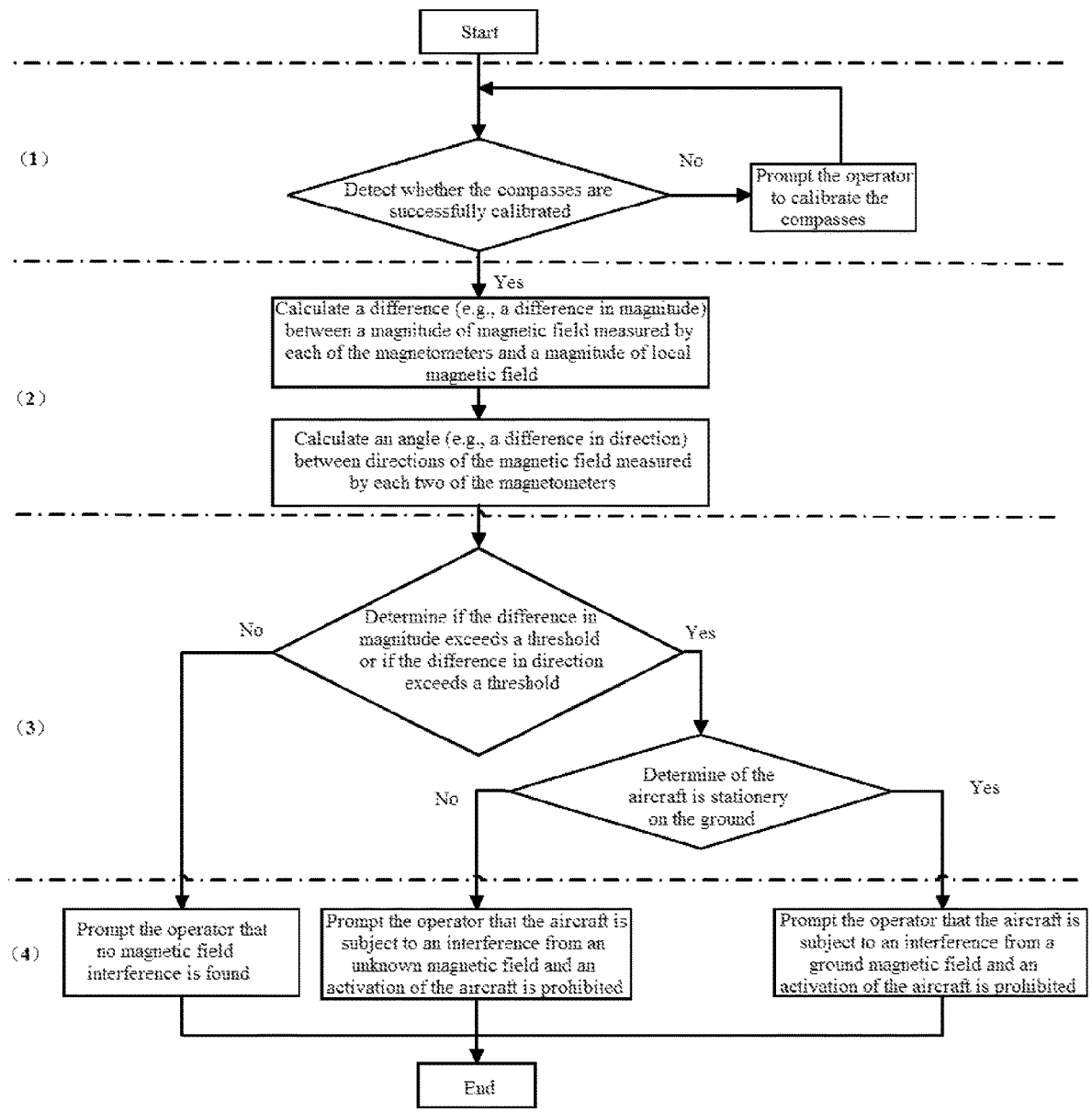
FIG. 5 shows a flow chart of an algorithm of detecting a magnetic field interference with a UAV provided with a compass according to embodiments of the disclosure.

FIG. 5 shows a flow chart of an algorithm of detecting a magnetic field interference with an aircraft. In some embodiments, the method can comprise processes (1) to (4).

In process (1), before detecting a magnetic field interference, a calibration record of all the compasses can be obtained by the aircraft to determine whether all the compasses are successfully calibrated, and the operator can be prompted to calibrate the compasses.

In process (2), a difference (e.g., a difference in magnitude) between a magnetic field magnitude measured by each of the m magnetometers and a magnitude of local magnetic field can be calculated by the aircraft, and an angle (e.g., a difference in direction) between magnetic field directions measured by the plurality of magnetometers can be calculated by the aircraft.

In process (3), a determination can be made by the aircraft on whether a maximum difference in magnitude exceeds a magnitude threshold, or a determination can be made by the aircraft on whether a maximum difference in direction exceeds a direction threshold, a determination that the aircraft is subject to a magnetic field interference can be made if the maximum difference in magnitude exceeds the magnitude threshold and/or the maximum difference in direction exceeds the direction threshold, and a determination that the aircraft is not subject to a magnetic field interference can be made if the maximum difference in magnitude does not exceed the magnitude threshold and/or the maximum difference in direction does not exceed the direction threshold.

In process (4), a prompt can be provided to the operator that no magnetic field interference is found if the aircraft is not subject to a magnetic field interference, and an aircraft status information can be obtained to determine if the aircraft is positioned on the ground if the aircraft is subject to a magnetic field interference. In some instances, a prompt can be provided to the operator that the aircraft is subject to an interference from a ground magnetic field and an activation of the aircraft is prohibited if the aircraft is positioned on the ground. In some instances, a prompt can be provided to the operator that the aircraft is subject to an interference from an unknown magnetic field and an activation of the aircraft is prohibited if the aircraft is not positioned on the ground.

In an example embodiment shown in FIG. 2, the aircraft can be provided with two compasses. A compass 1 can be disposed at a bottom of a landing gear of the aircraft in proximal to the ground. The compass 1 can be likely to be affected by an interference from the ground magnetic field. A compass 2 can be disposed at a position away from the ground as compared to the compass 1; therefore the compass 2 can be less affected by an interference from the ground magnetic field. An error in a magnitude measurement and a direction measurement of the two compasses can be minor once they are calibrated. An interference from the ground magnetic field can be detected using the algorithm shown in FIG. 5 and an alert can be provided to the operator if a ferromagnetic material exists at the ground.

In embodiments of the disclosure, compasses are disposed at positions having different heights with respect to the ground to increase a sensitivity and accuracy in detecting an interference from the ground magnetic field. For instance, a plurality of compasses can be provided at various positions of the aircraft (e.g., a landing gear of the aircraft) as an effect of the interference from the ground magnetic field varies at different positions of the aircraft. The interference from the ground magnetic field can be detected on basis of a direction difference in measurements of the compasses and a difference between the measurements of the compasses and local magnetic field. With the embodiments of the disclosure, a sensitivity and accuracy in detecting a magnetic field interference, particularly an interference from the ground magnetic field, can be increased. An accurate alert with regard to the magnetic field interference can be provided to the aircraft and the operator to avoid an aircraft's taking off at a position where a flight requirement is not satisfied, thus a safety in a flight of the aircraft can be improved.

Figure 6:
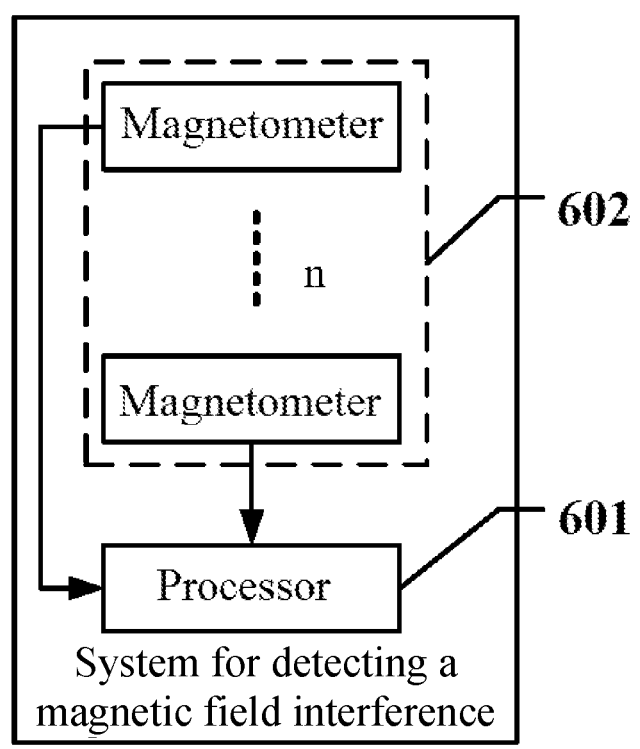
FIG. 6 shows a configuration of a system for detecting a magnetic field interference with a movable object according to an embodiment of the disclosure.

FIG. 6 shows a configuration of a system for detecting a magnetic field interference with a movable object according to an embodiment of the disclosure. In some embodiments, the system can comprise at least one processor 601 and n magnetometers 602.

Each one of the processor 601 can operate individually or collectively. The processor can be configured to obtain a respective magnetic field information measured by each one of the n magnetometers 602, where n being an integer greater than 1, calculate a magnetic difference between the respective magnetic field information measured by each one of the n magnetometers, and determine whether the movable object is subject to a magnetic field interference based on the magnetic difference.

In some embodiments, the n magnetometers 602 can be disposed at positions having different height with respect to a top of the movable object.

In some embodiments, the n magnetometers 602 can be provided at various positions of the movable object including at least one of a landing gear of the movable object, a body of the movable object, an arm of the movable object, a carrier of the movable object and a load of the movable object.

With embodiments of the disclosure, magnetic field information measured by the n magnetometers 602 can be obtained, a magnetic difference between respective magnetic field information measured by m magnetometers can be calculated, and a determination can be made on whether the movable object is subject to a magnetic field interference based on the magnetic difference. A detection on an interference from a non-uniform local magnetic field can be effected, and a sensitivity in interference detection and a safety of the movable object can be improved.

The process of determining whether the movable object is subject to a magnetic field interference based on the magnetic difference can vary according to a content of the magnetic difference.

For instance, the magnetic field information can comprise a magnetic field vector.

The processor 601 can be configured to calculate a difference between a magnetic field vector measured by each of the m magnetometers 602 and a vector of local magnetic field to obtain a set of m difference, and determine whether the movable object is subject to a magnetic field interference based on the set of differences.

In some instances, the magnetic field vector can comprise a magnetic field direction, and the set of differences can comprise a first set of angles, which angle is an angle between magnetic field directions measured by the m magnetometers 602. The processor 601 can be configured to determine whether the movable object is subject to a magnetic field interference based on at least one angle in the first set. For instance, a determination that movable object being subject to a magnetic field interference can be made if at least one angle in the first set exceeds a predetermined angle threshold.

In some instances, the magnetic field vector can comprise a magnetic field magnitude, and the set of differences can comprise a second set of magnitude difference, which magnitude difference is a difference between a magnetic field magnitude measured by each of the m magnetometers 602 and a magnitude of local magnetic field. The processor 601 can be configured to determine whether the movable object is subject to a magnetic field interference based on at least one magnitude difference in the second set. For instance, a determination that movable object being subject to a magnetic field interference can be made if at least one magnitude difference in the second set exceeds a predetermined magnitude threshold.

For instance, the magnetic field information can comprise an angle of the magnetic field.

The processor 601 can be configured to calculate an angle between an angle of magnetic field measured by each of the m magnetometers 602 and an angle of local magnetic field, such that a first set of angles can be obtained, and determine whether the movable object is subject to a magnetic field interference based on at least one angle in the first set. For instance, a determination that movable object being subject to a magnetic field interference can be made if at least one angle in the first set exceeds a predetermined angle threshold.

For example, a determination that the movable object being subject to a magnetic field interference can be made if a maximum angle in the first set exceeds a predetermined angle threshold.

For instance, the magnetic field information can comprise a magnetic field magnitude.

The processor 601 can be configured to calculate a magnitude difference between a magnetic field magnitude measured by each of the m magnetometers 602 and a magnitude of local magnetic field, such that a second set of magnitude difference can be obtained, and determine whether the movable object is subject to a magnetic field interference can be made based on at least one magnitude difference in the second set. For instance, a determination that movable object being subject to a magnetic field interference can be made if at least one magnitude difference in the second set exceeds a predetermined magnitude threshold.

For example, a determination that the movable object being subject to a magnetic field interference can be made if a maximum magnitude difference in the second set exceeds a predetermined magnitude threshold.

It will be appreciated that, in some embodiments, both a maximum angle in the first set and a maximum magnitude difference in the second set can be used to determine whether the movable object is subject to a magnetic field interference.

In some embodiments, the movable object can be provided with a first magnetometer 602 and a second magnetometer 602. During a movement of the movable object, the first magnetometer 602 can be positioned on the movable object at a position having a distance from the local magnetic field less than a first threshold, and the second magnetometer 602 can be positioned on the movable object at a position having a distance from the local magnetic field greater than the first threshold.

The processor can be configured to obtain a first magnetic field vector measured by the first magnetometer 602 and a second magnetic field vector measured by the second magnetometer 602; calculate a difference between the first magnetic field vector and a vector of local magnetic field, calculate a difference between the second magnetic field vector and the vector of local magnetic field, and calculate an angle between the first magnetic field vector and the second magnetic field vector; and determine the movable object is subject to an interference from local magnetic field if a greater one of the difference between the first magnetic field vector and the vector of local magnetic field and the difference between the second magnetic field vector and the vector of local magnetic field exceeds a second threshold and the angle exceeds a third threshold.

In some embodiments, when the movable object is in a normal moving state, the first magnetometer 602 and the second magnetometer 602 can be magnetometers having a largest difference in height along a direction of gravity.

In some embodiments, the processor 601 can be configured to determine a largest magnetic difference from the magnetic difference between respective magnetic field information measured by m magnetometers, and determine whether the movable object is subject to a magnetic field interference based on the largest magnetic difference.

In some embodiments, the magnetic difference between respective magnetic field information measured by m magnetometers can comprise at least one of a magnitude difference, which is a difference between respective magnetic field magnitude measured by the m magnetometers and a magnitude of local magnetic field, and/or an angle between respective magnetic field direction measured by the m magnetometers.

In some embodiments, prior to obtaining magnetic field information measured by the n magnetometers 602, the processor 601 can be further configured to obtain a calibration record of the n magnetometers 602, and calibrate any magnetometer which is not successfully calibrated if a determination is made that one or more of the n magnetometers 602 are not successfully calibrated based on the calibration record.

In some embodiments, once a determination is made that the movable object is subject to an interference from the local magnetic field, the processor 601 can be further configured to obtain a current device state of the movable object, and direct the movable object to automatically initiate a protection control command or send alert notification to a control terminal according to the current device state.

In some embodiments, the processor 601 can be configured to instruct the aircraft to stop a taking off if the device state of the aircraft shows the aircraft is taking off, and/or instruct the aircraft to return if the device state of the aircraft shows the aircraft is in a flight.

In some embodiments, once a determination is made that the movable object is subject to an interference from the local magnetic field, the processor 601 can be further configured to determine a position of the local magnetic field based on a magnetic field vector of the local magnetic field. The alert notification can comprise the interference source information which comprising the position of the local magnetic field.

Figure 7:
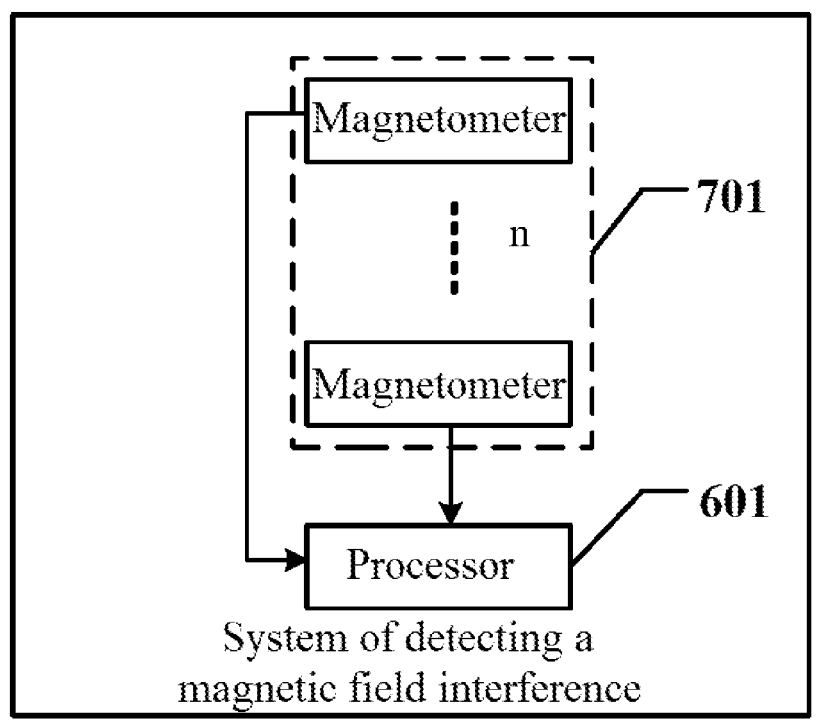
FIG. 7 shows a configuration of a system for detecting a magnetic field interference with a movable object according to another embodiment of the disclosure.

FIG. 7 shows a configuration of a system for detecting a magnetic field interference with a movable object according to another embodiment of the disclosure. In some embodiments, the system can comprise n magnetometers 701, each of which being configured to measure magnetic field information of a magnetic field in which the movable object is positioned, and a processor 601. The n magnetometers 701 can be in communication connection with the processor 601.

In some embodiments, the processor 601 can substantially correspond to the processor 601 shown in FIG. 6.

Figure 8:
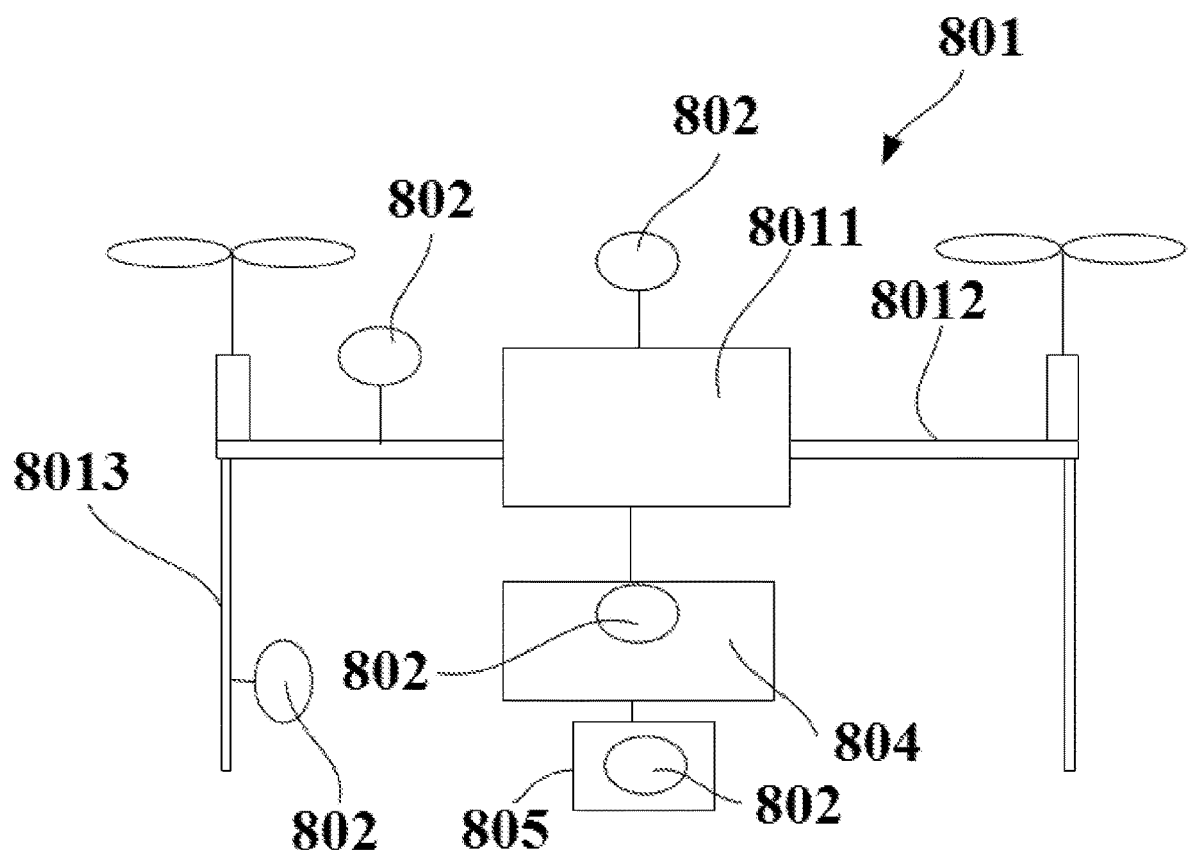
FIG. 8 shows a configuration of a system for detecting a magnetic field interference with a movable object according to still another embodiment of the disclosure.

FIG. 8 shows a configuration of a movable object according to embodiments of the disclosure. In some embodiments, the movable object 80 can comprise a body frame 801, n magnetometers 802 and a processor 601 which can substantially correspond to the processor 601 shown in FIG. 6. The n magnetometers 802 can be in communication connection with the processor 601, where n is an integer greater than or equal to 2. The n magnetometers 802 can be disposed at different positions of the body frame 801. Each one of the n magnetometers 802 can be configured to measure magnetic field information of a magnetic field in which the movable object 80 is positioned.

In some embodiments, the n magnetometers 802 can be provided at different height with respect to a top of the movable object 80.

In some embodiments, the body frame 801 can comprise a body 8011, an arm 8012 which is coupled to the body 8011, and a landing gear 8013 which is coupled to the body 8011.

In some embodiments, the n magnetometers 802 can be provided at various positions of the movable object 80 including at least one of the landing gear 8013, the body 8011, the arm 8012, a carrier 804 of the movable object 80, or a load 805 of the movable object 80.

The disclosure further provides a computer storage media storing a program. The program, once being executed, can implement some or all steps of the method of detecting a magnetic field interference.

The disclosure further provides a computer storage media storing a program. The program, once being executed, can direct the movable object or the system for detecting a magnetic field interference to implement some or all steps of the method of detecting a magnetic field interference.

It will be apparent that, details of the disclosures are described in various embodiments as discussed hereinabove. Some details of the disclosure may be omitted from the description of an embodiment, and reference can be made to a relevant description of other embodiments.

Those skilled in the art will appreciate that, a description of the system, apparatuses and units can be cleat with reference to a description of corresponding processes of the methods. A detailed description of the description of the system, apparatuses and units may be omitted in the disclosure for conciseness.

It will be appreciated that, the device and method disclosed in embodiments of the disclosure can be implemented in other manners. For instance, the described device embodiments are merely illustrative. For instance, a division of modules or units is merely a division based upon a logical function. Various divisions can be possible in actual implementation. For instance, multiple units or components can be combined or integrated on another system. For instance, some features can be ignored or not be performed. For instance, a mutual coupling, a direct coupling or a communication connection as shown or discussed can be an indirect coupling or a communication connection via an interface, a means or a unit. The coupling can be an electrical coupling or a mechanical coupling.

The units illustrated as separate parts may or may not be physically separated. The parts shown as units may or may not be physical units. For instance, the parts can be provided at the same location or distributed over a plurality of network units. All or some of the units can be selected to implement the embodiments of the disclosure according to actual requirements.

Various functional units in the embodiments of the disclosure may be integrated in one processing unit. The functional units can be separate and physical units. Two or more units may be integrated in one unit. The integrated units may be implemented as hardware or software functional units.

The integrated units, if implemented as software functional units and sold or used as independent products, may be stored in a computer-readable storage medium. With such an understanding, all or part of the technical solution may be embodied as a software product. The computer software product is stored in a storage medium and includes several instructions for causing a computing device (e.g., personal computer, server, or network devices) to execute all or part of steps of the method according to the various embodiments of the disclosure. The above mentioned storage medium includes: various media capable of storing program code, such as a U disk, a removable hard disk, ROM (read-only memory), RAM (random access memory), a diskette, an optical disk, etc.

The disclosure provides a method, a control apparatus and a control system for controlling an image capture of a movable device. Illustrative embodiments are provided in the disclosure to describe principles of the disclosure, which embodiments are merely provided to illustrate the method of the disclosure. Any equivalent changes in embodiments and applications of the disclosure made in light of the spirit of the disclosure should all be encompassed in the scope of the disclosure.

What is claimed is:

1. A method of detecting a magnetic field interference comprising:
   obtaining magnetic field information measured by each one of n magnetometers carried by a movable object, n being an integer greater than or equal to 2;
   determining magnetic differences between the magnetic field information measured by m magnetometers of the n magnetometers, m being an integer greater than or equal to 2 but smaller than or equal to n; and
   determining whether the movable object is subject to a magnetic field interference based on the magnetic differences.

2. The method of claim 1, wherein:
   the magnetic field information includes magnetic field vectors,
   determining the magnetic differences includes obtaining a set of vector differences each being a difference between the magnetic field vector measured by one of the m magnetometers and a vector of a local magnetic field, and
   determining whether the movable object is subject to the magnetic field interference includes determining based on the set of vector differences.

3. The method of claim 2, wherein:
   the magnetic field vectors include magnetic field directions,
   the set of vector differences includes a set of angles each being an angle between the magnetic field directions measured by two of the m magnetometers, and
   determining whether the movable object is subject to the magnetic field interference includes determining the movable object is subject to the magnetic field interference if a maximum angle in the set of angles exceeds a predetermined angle threshold.

4. The method of claim 2, wherein:
   the magnetic field vectors include magnetic field magnitudes, the set of vector differences includes a set of magnitude differences each being a difference between the magnetic field magnitude measured by one of the m magnetometers and a magnitude of the local magnetic field, and determining whether the movable object is subject to the magnetic field interference includes determining the movable object is subject to the magnetic field interference if a maximum magnitude difference in the set of magnitude differences exceeds a predetermined magnitude threshold.

5. The method of claim 2, wherein:
the m magnetometers include a first magnetometer and a second magnetometer, during a movement of the movable object, the first magnetometer being positioned on the movable object at a position having a distance from the local magnetic field less than a first threshold, and the second magnetometer being positioned on the movable object at a position having a distance from the local magnetic field greater than the first threshold, and obtaining the set of vector differences includes:
  obtaining a first magnetic field vector measured by the first magnetometer and a second magnetic field vector measured by the second magnetometer; and
  calculating a first magnitude difference between a magnitude of the first magnetic field vector and a magnitude of the vector of the local magnetic field;
  calculating a second magnitude difference between a magnitude of the second magnetic field vector and the magnitude of the vector of local magnetic field; and
  calculating an angle between the first magnetic field vector and the second magnetic field vector, and determining whether the movable object is subject to the magnetic field interference includes determining that the movable object is subject to an interference from the local magnetic field if a greater one of the first magnitude difference and the second magnitude difference exceeds a second threshold and the angle exceeds a third threshold.

6. The method of claim 5, wherein the first magnetometer and the second magnetometer are two magnetometers having a largest difference in height along a direction of gravity among the m magnetometers when the movable object is in a normal moving state.

7. The method of claim 1, wherein:
the magnetic field information includes magnetic field directions,
determining the magnetic difference includes calculating a set of angles each being an angle between the magnetic field direction measured by one of the m magnetometers and a direction of a local magnetic field, and
determining whether the movable object is subject to the magnetic field interference includes determining that the movable object is subject to the magnetic field interference if a maximum angle in the set of angles exceeds a predetermined angle threshold.

8. The method of claim 1, wherein:
the magnetic field information includes magnetic field magnitudes,
determining the magnetic difference includes calculating a set of magnitude differences each being a difference between the magnetic field magnitude measured by one of the m magnetometers and a magnitude of a local magnetic field, and determining whether the movable object is subject to the magnetic field interference includes determining that the movable object is subject to the magnetic field interference if a maximum magnitude difference in the set of magnitude differences exceeds a predetermined magnitude threshold.

9. The method of claim 1, wherein determining whether the movable object is subject to the magnetic field interference includes:
  determining a maximum magnetic difference from among the magnetic differences, and
  determining whether the movable object is subject to the magnetic field interference based on the maximum magnetic difference.

10. The method of claim 1, wherein each of the magnetic difference includes at least one of:
  a difference between a magnetic field magnitude measured by one of the m magnetometers and a magnitude of a local magnetic field, or
  an angle between magnetic field directions measured by two of the m magnetometers.

11. The method of claim 1, further comprising, prior to obtaining the magnetic field information:
  obtaining a calibration record of the n magnetometers; and
  in response to the calibration record indicating that one or more magnetometers of the n magnetometers are not calibrated, calibrating the one or more magnetometers.

12. The method of claim 1, further comprising, in response to determining that the movable object is subject to the magnetic field interference:
  obtaining a current device state of the movable object; and
  directing the movable object to automatically initiating a protection control command or sending an alert notification to a control terminal according to the current device state.

13. The method of claim 12, wherein:
the movable object includes an aircraft, and
directing the movable object to automatically initiate the protection control command includes:
  initiating a command instructing the aircraft to stop taking off in response to the current device state indicating the aircraft is taking off; and/or
  initiating a command instructing the aircraft device to return if the current device state indicates the aircraft is in flight.

14. The method of claim 1, further comprising, in response to determining that the movable object is subject to the magnetic field interference:
  determining a position of a local magnetic field based on a vector of the local magnetic field; and
  sending an alert notification containing interference information of the position of the local magnetic field.

15. The method of claim 1, wherein the n magnetometers are disposed at positions having different heights with respect to a top of the movable object.

16. The method of claim 1, wherein the n magnetometers are provided at various positions of the movable object including at least one of a landing gear of the movable object, a body of the movable object, an arm of the movable object, a carrier of the movable object, or a load of the movable object.

17. A system for detecting a magnetic field interference comprising:
  at least one processor configured to, individually or collectively:

obtain magnetic field information measured by each one of n magnetometers carried by a movable object, n being an integer greater than or equal to 2;

determine magnetic differences between the magnetic field information measured by m magnetometers of the n magnetometers, m being an integer greater than or equal to 2 but smaller than or equal to n; and determine whether the movable object is subject to a magnetic field interference based on the magnetic differences.

18. A movable object comprising:

a body frame;

n magnetometers disposed at different positions of the body frame, each one of the n magnetometers being configured to measure magnetic field information of a magnetic field in which the movable object is positioned, n being an integer greater than or equal to 2; and a processor communicatively coupled with the n magnetometers and configured to:

obtain the magnetic field information measured by each one of the n magnetometers;

determine magnetic differences between the magnetic field information measured by m magnetometers of the n magnetometers, m being an integer greater than or equal to 2 but smaller than or equal to n; and determine whether the movable object is subject to a magnetic field interference based on the magnetic differences.

19. The movable object of claim 18, wherein the body frame includes:

a body;

an arm coupled to the body; and a landing gear coupled to the body.

20. The movable object of claim 19, wherein the n magnetometers are provided at various positions of the movable object including at least one of the landing gear, the body, the arm, a carrier of the movable object, or a load of the movable object.

* * * * *